United States Patent [19]

Walls et al.

[11] Patent Number: 4,575,690
[45] Date of Patent: Mar. 11, 1986

[54] ACCELERATION INSENSITIVE OSCILLATOR

[75] Inventors: Fred L. Walls, Boulder, Colo.; John R. Vig, Colts Neck, N.J.

[73] Assignee: The United States of America as represented by the Secretary of the Army, Washington, D.C.

[21] Appl. No.: 715,862

[22] Filed: Mar. 25, 1985

[51] Int. Cl.[4] .................................................. H03B 5/32
[52] U.S. Cl. .................................... 331/162; 331/116 R; 331/158
[58] Field of Search ..................... 310/311, 360, 361; 331/116 R, 158, 160, 162

[56] References Cited

U.S. PATENT DOCUMENTS

| | | | |
|---|---|---|---|
| 3,978,432 | 8/1976 | Onoe | 331/162 |
| 4,344,010 | 8/1982 | Vig et al. | 310/361 |
| 4,365,182 | 12/1982 | Ballato et al. | 310/361 |
| 4,410,822 | 10/1983 | Filler | 310/311 |
| 4,451,755 | 5/1984 | Vig et al. | 310/361 |
| 4,453,141 | 6/1984 | Rosati | 331/158 |

Primary Examiner—Eugene R. LaRoche
Assistant Examiner—James C. Lee
Attorney, Agent, or Firm—Anthony T. Lane; Jeremiah G. Murray; John T. Rehberg

[57] ABSTRACT

A crystal oscillator, including two crystals of unequal acceleration sensitivity magnitude and mounted such that their respective acceleration sensitivity vectors are aligned in an anti-parallel relationship, further includes at least one electrical reactance, such as a variable capacitor, coupled to one of the crystals for providing cancellation of acceleration sensitivities. After the acceleration sensitivity vectors of the two crystals are aligned anti-parallel, the variable capacitor is adjusted until the net or resultant acceleration sensitivity vector of the pair of resonators is reduced to zero. A second electrical reactance, such as a variable capacitor, is utilized as a tuning capacitor for adjusting the oscillator's output frequency to the desired value, while maintaining the cancellation of acceleration sensitivities.

26 Claims, 4 Drawing Figures

ACCELERATION INSENSITIVE OSCILLATOR

The invention described herein may be manufactured, used and licensed by or for the Government for governmental purposes without the payment of any royalties thereon or therefor.

BACKGROUND OF THE INVENTION

1. Field of the Invention

This invention relates generally to improvements in the acceleration sensitivity of quartz crystal oscillators and more particularly to the elimination of acceleratioinduced frequency shifts in such oscillators.

2. Description of the Prior Art

Quartz crystals, also called "crystals", "resonators" and "crystal resonators", are commonly used to control the frequency of electrical oscillators and in other circuits where an electrical resonant frequency is required. A major problem with such crystals is that their natural resonant frequency changes when acceleration forces are applied. The deleterious effects of these frequency shifts are well known to those skilled in the art.

There are two classes of methods for reducing the acceleration sensitivity of a crystal, namely active and passive. In active methods, an acceleration sensor and a feedback network is used to alter the oscillator frequency and thereby compensate for the acceleration induced frequency shifts. In passive methods, no attempt is made to sense the vibration or to dynamically change the output frequency.

One passive method of minimizing acceleration induced frequency shifts is disclosed in U.S. Pat. No. 4,365,182, entitled, "Method Of Fabricating Acceleration Resistant Crystal Resonators And Acceleration Resistant Crystal Resonators So Formed", issued to Arthur Ballato, et al. on Dec. 21, 1982. In that patent, the disclosed feature is that acceleration resistant resonators can be produced from a single quartz plate that is optically twinned into a left handed quartz portion and a right handed portion with the effective thickness of the two portions being equal. After depositing a pair of electrodes on each portion of the plate, the thickness of the electrode pairs is adjusted so that the resonant frequency of one or left hand (LH) portion is substantially the same as the resonant frequency of the other or right hand (RH) portion.

Another approach to the problem is disclosed in U.S. Pat. No. 4,344,010, entitled, "Acceleration Resistant Combination Of Opposite Handed Piezoelectric Crystals", which issued to John R. Vig, et al. on Aug. 10, 1982. That patent shows that acceleration sensitivity can be minimized by the use of two separate resonators, one left handed and one right handed, that are aligned such that all three crystallographic axes are anti-parallel.

In a more recent invention disclosed in U.S. Pat. No. 4,410,822, entitled, "Acceleration Resistant Crystal Resonator", issued to Raymond L. Filler on Oct. 18, 1983, a crystal resonator configuration is disclosed wherein the magnitude and direction of the acceleration sensitivity vectors of the two crystals are determined and a composite resonator is constructed by aligning two vectors in an anti-parallel relationship. When the acceleration sensitivity vectors of the two crystals are of equal magnitude, a more complete cancellation of vibrational effects is achieved for all acceleration directions.

Another approach to the acceleration sensitivity problem is taught in U.S. Pat. No. 4,451,755, entitled, "Acceleration Sensitivity Reduction Method", which issued to John R. Vig, et al. on May 29, 1984. In that patent, the acceleration sensitivity of an AT-cut quartz crystal resonator is reduced by replacing the quartz crystal plate of the resonator with a quartz crystal plate having a flatter plate contour thereupon the acceleration sensitivity coefficient decreases approximately linearly with the diopter value.

An active method of reducing the acceleration sensitivity of a crystal is disclosed in U.S. Pat. No. 4,453,141, entitled, "Suppression Vibration Effects On Piezoelectric Crystal Resonators", which issued to Vincent J. Rosati on June 5, 1984. What is taught there is the suppression or cancellation of the effects of vibration on quartz crystal controlled oscillators by generating an electrical signal which is a replica of the vibration acting on the crystal resonator, which signal is thereafter properly phased and applied directly to electrodes, which thereby operates to substantially eliminate unwanted vibration induced sidebands in the signal output of the oscillator.

It is an object of the present invention, therefore, to provide an improvement in the suppression of acceleration induced frequency shifts on crystal controlled oscillators.

It is another object of the invention to provide a substantially complete cancellation of vibrational effects on the crystal resonators of a crystal controlled oscillator.

And yet a further object of the invention is to provide a substantially complete cancellation of vibrational effects on the crystals of a crystal controlled oscillator as well as providing a substantially exact value of the desired oscillator frequency.

SUMMARY

These and other objects are achieved in accordance with a method and apparatus for further minimizing the acceleration sensitivity of a pair of crystals which are electrically connected together across an oscillator circuit wherein the magnitude and direction of the acceleration sensitivity vectors of the two crystals are first determined and the directions of the acceleration sensitivity vectors are aligned in an anti-parallel relationship. Where the crystals are electrically connected in series to the oscillator, a variable load reactance, e.g. a load capacitance, is further connected in parallel across one of the crystals and where the crystals are coupled in parallel to the oscillator circuit a variable load reactance is connected in series with one of the crystals. The load reactance is adjusted until any remaining acceleration sensitivity vector is reduced to zero. A second variable load reactance is connected in series between the pair of crystals and the oscillator circuit for fine tuning the oscillator's output frequency to a desired value. The load reactances may be both capacitive, or both inductive, or one may be capacitive and the other inductive.

DESCRIPTION OF THE DRAWINGS

While the present invention is defined in the claims annexed to and forming a part of this specification, a better understanding can be had by reference to the following description when taken in conjunction with the accompanying drawings in which:

DETAILED DESCRIPTION OF THE INVENTION

It is commonly known that a fractional frequency shift of the output frequency of a crystal oscillator is proportional to the change in acceleration magnitude that the oscillator experiences. The proportionality constant is a function of the direction of the acceleration sensitivity referenced to a given set of axes fixed to the oscillator. The magnitude and direction of the acceleration sensitivity can be defined as a vector $\Gamma$ and, as disclosed in the above referenced U.S. Pat. No. 4,410,822 issued to R. L. Filler, a crystal resonator comprised of two separate quartz crystals can be compensated for the effects of acceleration by combining the two into a composite resonator following a determination of the magnitude and direction of the acceleration sensitivity vectors $\Gamma$ of the respective crystals and then aligning the two vectors in an anti-parallel relationship.

The present invention is intended to provide: (1) an even more complete cancellation of the vibrational effects as taught in the Filler patent; (2) a complete cancellation of acceleration sensitivity even when the two crystals have unequal acceleration sensitivity magnitudes; and (3) a complete cancellation of acceleration sensitivities and an exact value of the desired oscillator frequency.

Figure 1:
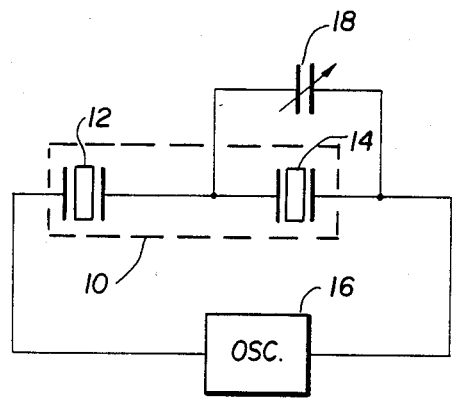
FIG. 1 is an electrical block diagram illustrative of a first embodiment of the invention.

This now leads to a consideration of the embodiments shown in the drawings. Referring now to the drawings and more particularly to FIG. 1, reference numeral 10 denotes a composite crystal resonator made up of two crystals 12 and 14 which have unequal magnitudes of acceleration sensitivity. Also their respective motional capacitances and frequencies may be different; however, the frequency difference between the two crystals should be less than the difference between the resonance and antiresonance frequency for either of the two crystals. Furthermore, the respective acceleration sensitivity vectors $\Gamma$ are aligned in an anti-parallel relationship such as taught in the above referenced Filler patent. The two crystal resonators 12 and 14 are connected electrically in series to an electrical oscillator circuit 16 with the composite resonator 10 being the primary frequency determining element of the oscillator circuit. The improvement in the cancellation of vibrational effects is achieved in the present invention by inclusion of a variable load capacitor 18 which may be in the form of a varactor diode which is coupled in parallel across the crystal that has the larger acceleration sensitivity magnitude, and which in the embodiment shown in FIG. 1 comprises the crystal 14. The purpose of the variable load capacitor 18 is to zero out any net or resultant sensitivity vector of the two crystals 12 and 14 following their anti-parallel alignment, thus eliminating any remaining acceleration induced frequency shifts resulting from acceleration in all directions. Thus while the anti-parallel alignment of the two unequal acceleration sensitivity vectors provide a certain degree of cancellation, a substantially complete cancellation of the acceleration sensitivity results from the inclusion of the variable capacitor 18. Typically, where the capacitor 18 comprises a varactor, i.e. a voltage variable diode, it is adjusted during vibration testing so as to minimize the acceleration sensitivity of the oscillator.

Figure 2:
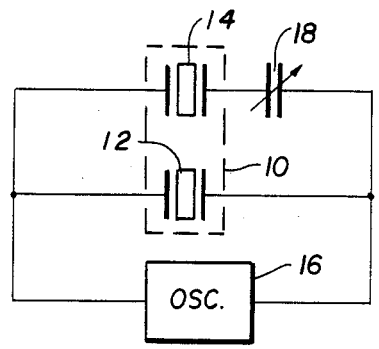
FIG. 2 is an electrical block diagram illustrative of a second embodiment of the invention.

With respect to FIG. 2, the embodiment shown there comprises a circuit configuration wherein the two crystals 12 and 14 making up the composite crystal resonator 10 are connected in parallel with one another across the oscillator circuit 16 but now having the variable capacitor 18 coupled in series with the crystal 14 which, in this case, is the crystal that has the larger acceleration sensitivity magnitude. It should be noted with respect to the embodiments disclosed in FIGS. 1 and 2 that the variable capacitor 18 is specifically connected to one of the crystals 12 and 14 depending on whether they are connected in series as shown in FIG. 1, or in parallel as shown in FIG. 2.

The significance of the present invention can be appreciated in view of the following hypothetical example. Consider the embodiment of FIG. 1 having a composite resonator 10 wherein the magnitude or scalar value $|\Gamma|$ of the acceleration sensitivity vector $\Gamma$ of crystal 12 is $5.0 \times 10^{-10}$ per g while the magnitude of the acceleration sensitivity vector $\Gamma$ of crystal 14 is $6.0 \times 10^{-10}$ per g. The minimum or net acceleration sensitivity achievable with the pair of crystals 12 and 14 after aligning the respective acceleration sensitivity vectors anti-parallel would be $1.0 \times 10^{-10}$ per g. This resultant magnitude of acceleration sensitivity vector $\Gamma$ can be eliminated or cancelled, i.e. reduced to zero, by the connection of the load capacitor 18 in parallel with the crystal 14 having the larger magnitude of acceleration sensitivity. If the crystal 12 were to have a larger magnitude of acceleration sensitivity, then the load capacitor 18 would be coupled across it. In the parallel configuration of FIG. 2, the load capacitor 18 is still coupled in series with the crystal 14 having the higher value of acceleration sensitivity.

That complete cancellation can be achieved by means of the load capacitor 18 can be seen from the following extension of the above examples. After the anti-parallel alignment of the two crystals, one can define the signs of the acceleration sensitivity vectors as positive for crystal 14 and negative for crystal 12, i.e., for crystal 14, $\Gamma = +6.0 \times 10^{-10}$ per g and for crystal 12, $\Gamma = -5.0 \times 10^{-10}$ per g. Accordingly, for the composite resonator, $\Gamma = +1.0 \times 10^{-10}$ per g. Now vary the value of load capacitor 18 from a very small value (open circuit in the limit) to a very large value (short circuit in the limit). In the open circuit limit, the load capacitor has no effect and the composite resonator $\Gamma = +1.0 \times 10^{-10}$. In the short circuit limit, all the current passes through the load capacitor and none passes through the crystal 14. The effect is the same as if the crystal 14 had been removed from the circuit and, therefore, the composite resonator's $\Gamma$ is that of crystal 12, i.e., $-5.0 \times 10^{-10}$ per g. Thus it can be seen that as the capacitance of the load capacitor is varied from a very small value to a very large value, the $\Gamma$ of the composite resonator varies from $+1.0 \times 10^{-10}$ per g to $-5.0 \times 10^{-10}$ per g. Since the load capacitor 18 can vary the $\Gamma$ of the composite resonator from positive to negative values, there must exist a load capacitance value for which $\Gamma = 0$. This value of the load capacitance is calculable if the exact parameters of crystals 12 and 14 and of the oscillator circuit are known; however, it may be more practical to initially select the approximate load capacitance value, then to tune the load capacitance during vibration testing to the exact value needed to minimize the oscillator Γ.

Figure 3:
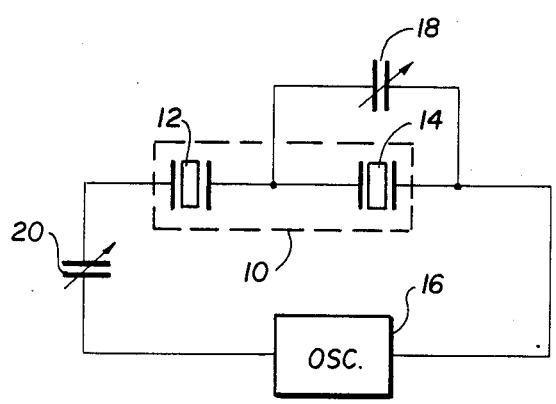
FIG. 3 is an electrical block diagram of a modification of the embodiment shown in FIG. 1.
Figure 4:
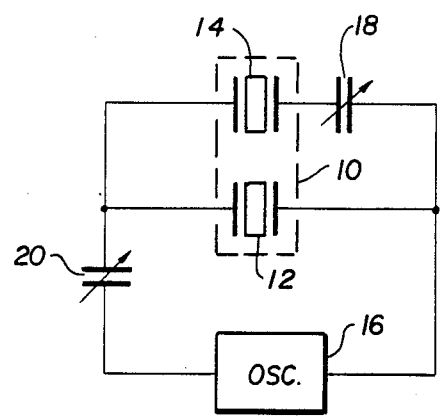
FIG. 4 is an electrical block diagram illustrative of a modification of the embodiment shown in FIG. 2.

Subsequent to the adjustment of load capacitor 18 to the value that minimizes the oscillator's acceleration sensitivity, the output frequency of the oscillator will, in general, be away from the desired value. A second load reactance, e.g. a load capacitor 20 as shown in FIGS. 3 and 4, can be connected in series between the oscillator circuit 16 and the composite resonator 10 and comprises a modification of the embodiments shown in FIGS. 1 and 2, respectively. The purpose of the second variable load capacitor 20 is to act as a tuning capacitor which adjusts the oscillator frequency to an exact value of the desired output frequency value following the zero net acceleration sensitivity adjustment which is provided by the first mentioned load capacitor 18.

In order to facilitate the tuning of the oscillator's output frequency to the desired value, the two crystals 12 and 14 can be selected to have different capacitance ratios. For example, crystal 12 can be a 5 MHz 3rd overtone SC-cut crystal and crystal 14 can be a 5 MHz fundamental mode SC-cut crystal, or, as another example, crystal 12 can be a 200 MHz 3rd overtone SC-cut crystal and crystal 14 can be a 200 MHz 3rd overtone AT-cut crystal.

Whereas load capacitances 18 and 20 have been shown in the embodiments of FIGS. 1 to 4, they may be generalized to be load reactances, meaning that the tunings of Γ and of the oscillator output frequency may also be achieved by means of inductors. Moreover, one of the two load reactances can be a capacitor and the other an inductor, so that when desirable, the load reactances can be combinations of capacitors and inductors. The load capacitor 20 can also be replaced by a delay line which may be adjustable.

Thus what has been shown and described is a method and means for providing substantially a complete cancellation of any net acceleration sensitivity vector Γ of a composite crystal resonator 10 comprised of two crystals 12 and 14 which are aligned such that their acceleration sensitivity vectors are anti-parallel. Moreover, the invention applies to resonators not only made of quartz but other materials as well, for example, berlinite and lithium tantalate. The invention further is applicable not only to bulk-wave resonators, but also to other type of resonators, such as surface acoustic wave resonators and shallow bulk acoustic wave resonators.

While there has been shown and described what is at present considered to be the preferred embodiments of the invention, it is noted that the same has been made by way of illustration and not limitation. Accordingly, all modifications, alterations and changes coming within the spirit and scope of the invention as set forth in the appended claims are herein meant to be included.

We claim:

1. A method of suppressing the effects of vibration acting on a crystal resonator which comprises the primary frequency determining element of a crystal controlled oscillator, comprising the steps of:
   determining the magnitude and direction of the acceleration sensitivity vector representing the maximum change in frequency per change in acceleration for a first crystal;
   determining the magnitude and direction of the acceleration sensitivity vector representing the maximum change in frequency per change in acceleration for a second crystal;
   positioning two of said first and second crystals such that the respective acceleration sensitivity vectors are anti-parallel;
   electrically coupling said two crystals as a composite crystal resonator to an electrical oscillator circuit; and
   coupling electrical reactance means to one of said crystals for cancelling any difference in the magnitudes of the acceleration sensitivity vectors of said two crystals.

2. The method as defined by claim 1 wherein said reactance means comprises capacitive reactance means.

3. The method as defined by claim 1 wherein said reactance means comprises inductive reactance means.

4. The method as defined by claim 1 wherein said two crystals are electrically connected in series to said oscillator circuit and wherein said reactance means comprises variable capacitance means coupled in parallel across one of said two crystals.

5. The method as defined by claim 4 wherein said variable capacitance means is coupled across the crystal of said two crystals having the greater magnitude of acceleration sensitivity.

6. The method as defined by claim 1 wherein said first and second crystal are connected in parallel to said oscillator circuit.

7. The method as defined by claim 6 and wherein said reactance means is connected in series to one of said crystals.

8. The method as defined by claim 7 wherein said reactance means comprises capacitive reactance means.

9. The method as defined by claim 7 wherein said reactance means comprises inductive reactance means.

10. The method as defined by claim 7 wherein said reactance means comprises variable capacitance means connected in series to the crystal of said two crystals having the larger magnitude of acceleration sensitivity.

11. The method as defined by claim 1 and additionally including the step of coupling electrical reactance means between said composite resonator and said oscillator circuit for adjusting the output frequency of the oscillator circuit.

12. The method as defined by claim 11 wherein said reactance means of the last recited step comprises capacitive reactance means.

13. The method as defined by claim 11 wherein said reactance means of the last recited step comprises inductive reactance means.

14. The method as defined by claim 11 wherein said reactance means coupled between said composite resonator and said oscillator circuit comprises variable capacitance means coupled in series therebetween.

15. The apparatus for suppressing the effects of vibration on a piezoelectric crystal resonator constituting the primary frequency determining element of a crystal controlled oscillator, comprising:
   an oscillator;
   a composite crystal resonator coupled to said oscillator and comprising first and second resonator crystals, each having an acceleration sensitivity vector of unequal magnitude, said crystals being further positioned such that the acceleration sensitivity vector of the first crystal is disposed in an anti-parallel relationship with the acceleration sensitivity vector of said second crystal whereby the effective acceleration in all directions on the resonant frequency of the composite crystal resonator is substantially reduced; and electrical reactance means coupled to at least one of said first and second resonator crystals for cancelling any net resultant acceleration sensitivity vector between said crystals.

16. The apparatus as defined by claim 15 wherein said reactance means comprises capacitive reactance means.

17. The apparatus as defined by claim 15 wherein said reactance means comprises inductive reactance means.

18. The apparatus as defined by claim 15 wherein said first and second resonator crystals are connected in series to said oscillator and wherein said reactance means comprises variable capacitance means coupled in parallel across one of said resonator crystals.

19. The apparatus as defined by claim 18 wherein said variable capacitance means is coupled across the resonator crystal having the greater magnitude of acceleration sensitivity.

20. The apparatus as defined by claim 15 wherein said first and second resonator crystals are connected in parallel to said oscillator and wherein said reactance means comprises variable capacitance means coupled in series to one of said resonator crystals.

21. The apparatus as defined by claim 20 and wherein said variable capacitance means is coupled in series to the resonator crystal having the greater magnitude of acceleration sensitivity.

22. The apparatus as defined by claim 15 and additionally including electrical reactance means coupled between said composite resonator and said oscillator for adjusting the output frequency of said oscillator to a desired value.

23. The apparatus as defined by claim 22 wherein said last recited reactance means comprises capacitive reactance means coupled in series between said composite resonator and said oscillator.

24. The apparatus as defined by claim 22 wherein said last recited reactance means comprises inductive reactance means coupled in series between said composite resonator and said oscillator.

25. The apparatus as defined by claim 22 and wherein said first and second crystals additionally have different capacitance ratios and are connected in series, and wherein said first recited reactance means coupled to one of said resonator crystals comprises variable capacitance means coupled in parallel to said one crystal whereby the parallel connected variable capacitance means is used to produce substantially zero net acceleration sensitivity, and wherein said last recited reactance means comprises variable capacitance means used as an output frequency tuning capacitor.

26. The apparatus as defined by claim 22 wherein said first and second crystals additionally have different capacitance ratios and are connected in parallel and wherein said first recited reactance means coupled to one of said resonator crystals comprises variable capacitance means coupled in series to said one crystal, whereby the first recited series capacitor means is used to produce substantially zero net acceleration sensitivity and wherein said last recited reactance means comprises variable capacitance means used as an output frequency tuning capacitor.

* * * * *